US006198311B1

(12) United States Patent
Shi et al.

(10) Patent No.: US 6,198,311 B1
(45) Date of Patent: Mar. 6, 2001

(54) EXPANDABLE ANALOG CURRENT SORTER BASED ON MAGNITUDE

(75) Inventors: Bingxue Shi; Gu Lin, both of Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/138,650

(22) Filed: Aug. 24, 1998

(51) Int. Cl.[7] .......... G01R 19/00

(52) U.S. Cl. .......... 327/58; 327/63; 327/71; 327/99

(58) Field of Search .......... 327/58, 62, 63, 327/71, 91, 99

(56) References Cited

U.S. PATENT DOCUMENTS 5,049,758 * 9/1991 Mead et al. .......... 365/185.21
5,059,814 * 10/1991 Mead et al. .......... 706/33
5,304,864 * 4/1994 Hong et al. .......... 327/62
5,703,503 * 12/1997 Miyamoto .......... 327/58

* cited by examiner

*Primary Examiner*—Jack Choules
(74) *Attorney, Agent, or Firm*—Rosenberg, Klein & Lee

(57) ABSTRACT

A current sorter for sorting a plurality of currents is disclosed. The current sorter comprises an input circuit unit for receiving a plurality of input currents to be sorted, a winner-take-all (WTA) circuit unit for finding the maximum current, a feedback control and voltage output circuit unit for generating feedback control signals and output voltages indicating the maximum current, and an output circuit unit for outputting sorted currents. A plurality of input currents are simultaneously input to the input circuit unit and the sorted results are output in a time-shared manner on the output circuit unit.

11 Claims, 7 Drawing Sheets

| Simulatim resulf | Iout | Iout | Iout | Emax |
|---|---|---|---|---|
| Case.1 | 138.9 | 135.2 | 132.1 | 2.1 |
| Case.2 | 102.2 | 97.4 | 92.6 | 2.6 |
| Case.3 | 52.7 | 47.5 | 42.6 | 2.7 |

Table 1 (unit: µA)

| Simulation result | Iout0 | Iout1 | Iout2 | Iout3 | Iout4 | Iout5 | εmax |
|---|---|---|---|---|---|---|---|
| Case 1 | 138.3 | 134.1 | 130.5 | 126.6 | 121.7 | 116.3 | 1.7 |
| Case 2 | 101.9 | 97.4 | 92.2 | 87.2 | 81.6 | 77.2 | 2.4 |
| Case 3 | 52.3 | 47.3 | 42.1 | 37.2 | 32.1 | 27.1 | 2.3 |

Table 2 (unit:μA)

EXPANDABLE ANALOG CURRENT SORTER BASED ON MAGNITUDE

BACKGROUND OF THE INVENTION

1. Field of the Invention

The present invention relates to a sorter for sorting a plurality of currents, more particular, to an expandable current magnitude sorter for sorting a plurality of currents.

2. Description of Related Art

Sorting is the operation of arranging non-sequential data into sequential data. Such sorting operations have been widely used in data processing system in many fields. Currently, there are several types of sorting processes available, such as bubble sorting, shell sorting, fast sorting, etc. However, those processes are difficult to perform in integrated circuitry. The sorting operation is implemented essentially by utilizing software in computers. Therefore, the operational speed, real-time processing and application for the sorting operation are seriously limited.

The implementation of the sorting operation in hardware has been gradually developed. However, the existing sorting circuits are almost always digital sorting circuits. The structure of a digital sorting circuit is very complicated and the required sorting time is very long. Although the digital sorting circuit can also be used for analog signals, A/D and D/A converters are required, so that the structure of the circuit is even more complicated. In addition, errors or transformations may occur in the conversion between digital signals and analog signals.

Accordingly, an analog current sorting circuit is desired, thus, the present invention is designed for this purpose.

SUMMARY OF THE INVENTION

One object of the present invention is to provide a current sorter which is an analog current sorter with simple structure.

Another object of the present invention is to provide a current sorter such that the number of currents to-be-sorted can be significantly increased by cascading a plurality of the current sorters. In accordance with one aspect of the present invention, the current sorter comprises an input circuit unit for receiving a plurality of input currents to-be-sorted, a winner-take-all (WTA) circuit unit for finding the maximum current, a feedback control and voltage output circuit unit for generating feedback control signals and output voltages indicating the maximum current, and an output circuit unit for outputting sorted currents. A plurality of input currents are simultaneously input to the input circuit unit and the sorted results are output in a time-shared manner on the output circuit unit.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
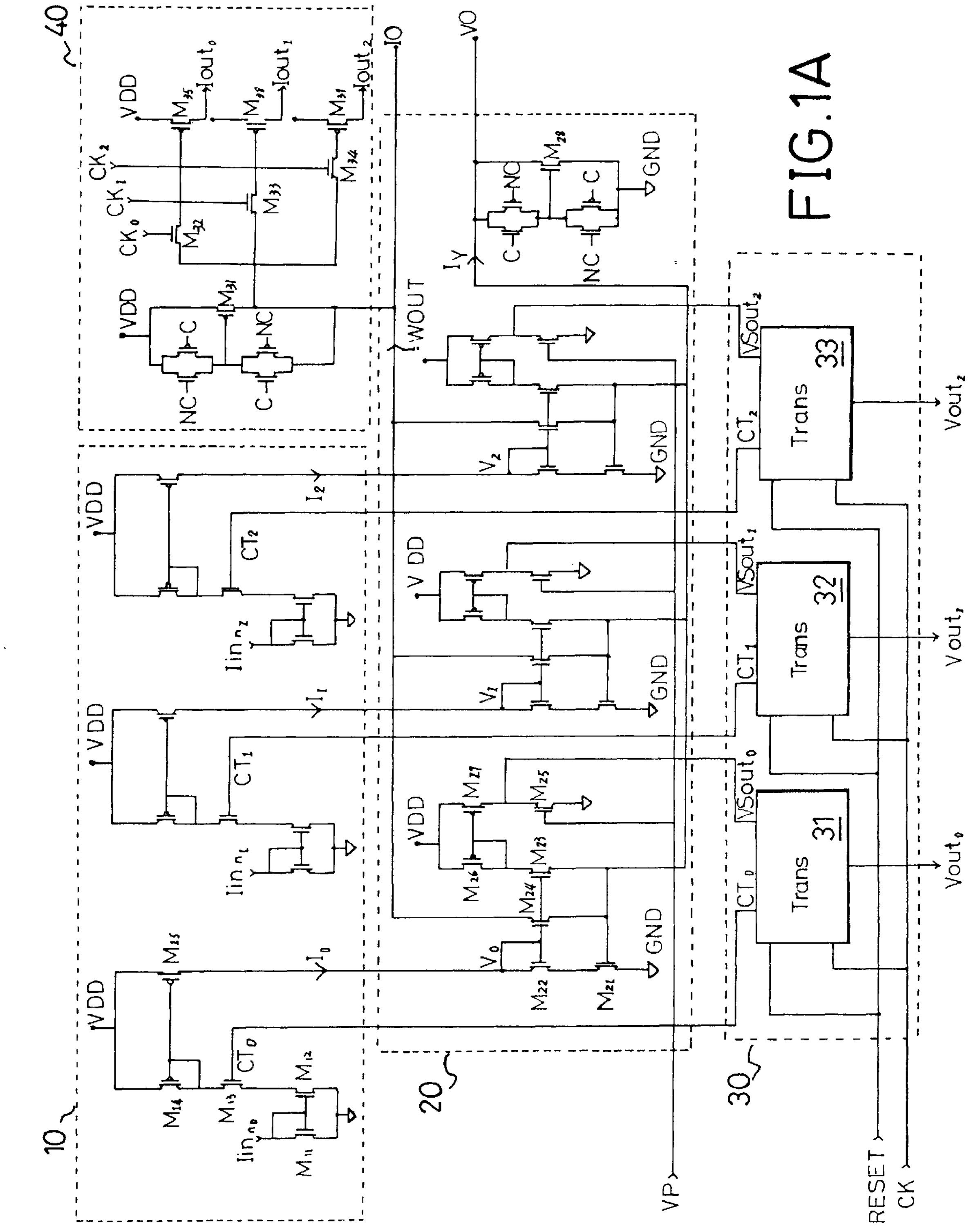
FIG. 1A and FIG. 1B are circuit diagrams of a current sorter in accordance with the present invention.

Referring to FIG. 1A, an embodiment of an expandable current sorter in accordance with the present invention is illustrated by taking three input currents for example, which comprises four circuit units: an input circuit unit 10, a winner-take-all (hereinafter abbreviated as WTA) circuit unit 20, a feedback control and voltage output circuit unit 30, and an output circuit unit 40.

The input circuit unit 10 comprises three identical input units where $Iin_i$ ($0 \leqq i \leqq 2$) designate three input currents to-be-sorted. For simplicity, only the input unit on the left-most side is described. In this input unit, mirror transistors $M_{11}$ and $M_{12}$ constitute a current mirror and mirror transistors $M_{14}$ and $M_{15}$ also constitutes another current mirror. A switch transistor $M_{13}$ controls the magnitude of an output current $I_0$. When the switch transistor $M_{13}$ is on, $I_0$equals $Iin_0$, and when the switch transistor $M_{13}$ is off, $I_0$ is zero.

The WTA circuit unit 20 having three inputs is provided to find the maximum current among the input currents. The WTA circuit unit 20 includes three identical sections and only the left-most section is described for convenience. In the WTA circuit unit 20, the dimensions of all the NMOS transistors corresponding to the transistors $M_{21}$, $M_{22}$, $M_{23}$ and $M_{24}$ are identical. The width to length ratio (W/L) of $M_{28}$ is twice as that of $M_{21}$. VO, IO terminals and control terminal C (NC is an inverse signal of C) are adapted for chip expansion which will be described later on. The WTA circuit unit 20 is a high-precision and high-speed interconnected network where the number of transistors therein is linearly related to that of the inputs thereof. To analyze the operation of the WTA circuit unit, the control terminal C is first set to a high voltage level which cause the gate and drain of the NMOS transistor $M_{28}$ short-connected whereby the transistor $M_{28}$ works in the saturation region and behaves as a diode. When the WTA circuit unit 20 is in operation, voltages $V_0$, $V_1$ and $V_2$ are established respectively by the input current $I_0$, $I_1$ and $I_2$ from input circuit unit 10. For the sake of convenience, assuming $I_0=\max(I_0, I_1, I_2)$, we have $V_0=\max(V_0, V_1, V_2)$. Transistors $M_{23}$, $M_{24}$ and corresponding NMOS transistors constitute a differential circuit, and voltages $V_0$, $V_1$ and $V_2$ are input voltages to the differential circuit. When $|V_0-V_i>(2I_y/\beta)^{1/2}$ for i=1,2 is satisfied, where $\beta=[\mu C_{ox}/2](W/L)$ and W/L is the width to length ratio of $M_{28}$, $I_Y$ flows through a differential transistor having the maximum input voltage; that is, the drain currents of $M_{23}$ and $M_{24}$ are $I_Y/2$ and the drain currents of the other corresponding differential transistors are zero. On the other hand, transistors $M_{21}$, $M_{22}$, $M_{23}$, $M_{24}$ and $M_{28}$ constitute a Willson current mirror resulting in $I_Y=2I_0$ and the drain currents of $M_{23}$ and $M_{24}$ being $I_0$. Therefore, we have $I_{wout}=I_0=\max(I_0, I_1, I_2)$ and the maximum current has been obtained. In addition, PMOS mirror transistors $M_{26}$ and $M_{27}$ and NMOS transistors $M_{25}$ constitute a non-linear current-to-voltage transform circuit. This current-to-voltage transform circuit transforms the drain current of $M_{23}$ to a low voltage level for outputting from $VSout_0$ if the drain current is smaller than a predetermined threshold value, and transforms the drain current of $M_{23}$ to a high voltage level for outputting from $VSout_0$ if the drain current is larger than the threshold value. The threshold value is adjusted by an external bias voltage VP. The other corresponding non-linear circuit-to-voltage transform circuits in WTA circuit unit 20 are similar to aforesaid transform circuit.

Figure 1B:
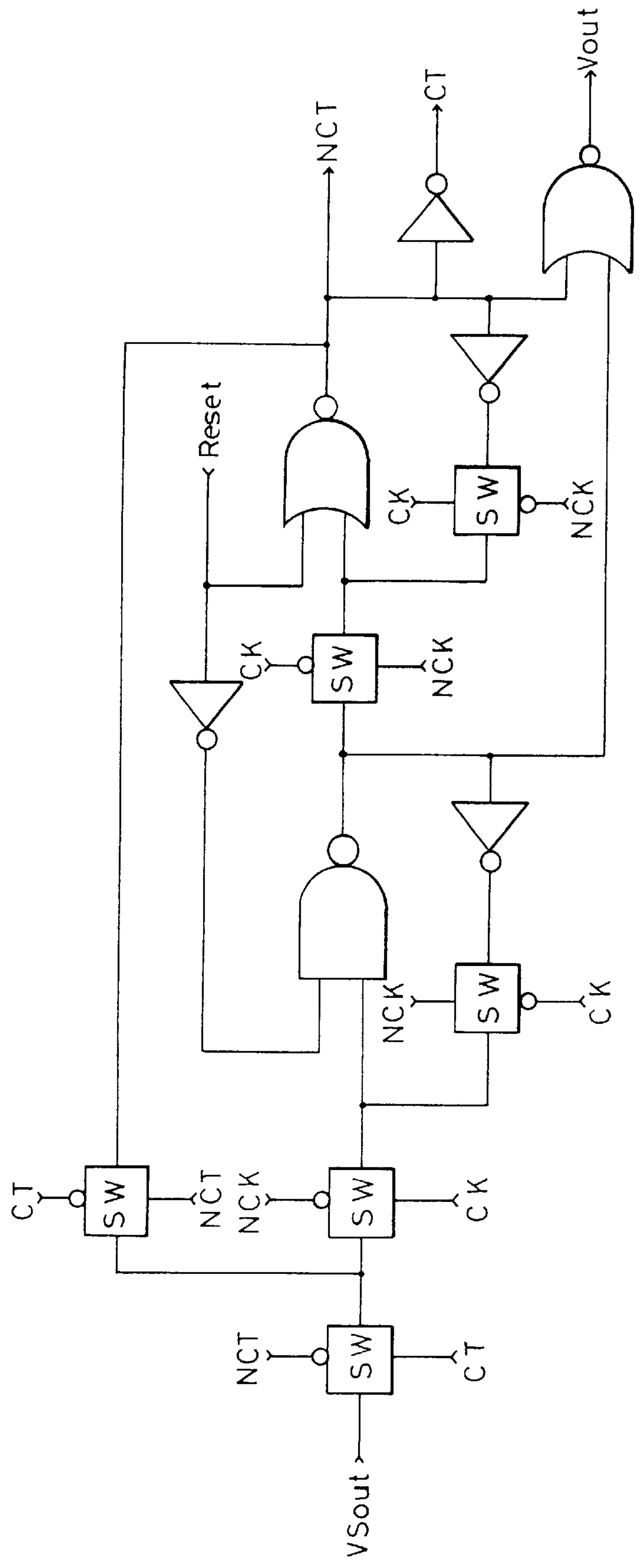

The feedback control and voltage output circuit unit 30 comprises three identical transfer units 31,32,33. The circuit diagram for each transfer unit 31,32,33 is shown in FIG. 1B where the SW unit therein is a CMOS switch and the NCK is an inverse signal of CK. The feedback control and voltage output circuit unit 30 generates feedback control signals $CT_i$ ($0 \leqq i \leqq 2$) according to $VSout_i$ ($0 \leqq i \leqq 2$), which are output from WTA circuit unit 20, to control the output currents of the input circuit unit 10. In addition, the feedback control and voltage output circuit unit 30 is able to convert the low-to-high voltage level from VSout to a high voltage pulse for outputting from Vout. This high voltage pulse is used to determine the corresponding input terminal with respect to the sorted output current for processing the sorted currents.

The output circuit unit 40 is designed for outputting sorted currents. NMOS transistors $M_{32}$, $M_{33}$ and $M_{34}$ are three switch transistors respectively controlled by non-overlapped clock signals $CK_0$, $CK_1$, and $CK_2$. PMOS transistors $M_{35}$, $M_{36}$, and $M_{37}$ are mirror transistors, each is identical to $M_{31}$ in size. The control terminal C (NC is an inverse signal of C) is used for chip expansion. In operating the current sorter, the IO terminal is floating and the control terminal C is set to high whereby the gate and drain of the PMOS transistor $M_{31}$ is short-connected. Under the control of clock $CK_i$ ($0 \leqq i \leqq 2$), the output current $I_{wout}$ from the WTA circuit unit 20 can be mirror-mapped to output terminals in a time shared way to generate $Iout_0$, $Iout_1$ and $Iout_2$. The $Iout_0$, $Iout_1$ and $Iout_2$ are the sorted currents of input currents $Iin_i$ ($0 \leqq i \leqq 2$).

Two operation modes are provided for the current sorter; they are single mode and expanded mode. In the single mode, there is only one chip with N inputs used to sort N input currents. In the expanded mode, there are M chips, each has N inputs, used to sort M×N input currents.

Figure 2:
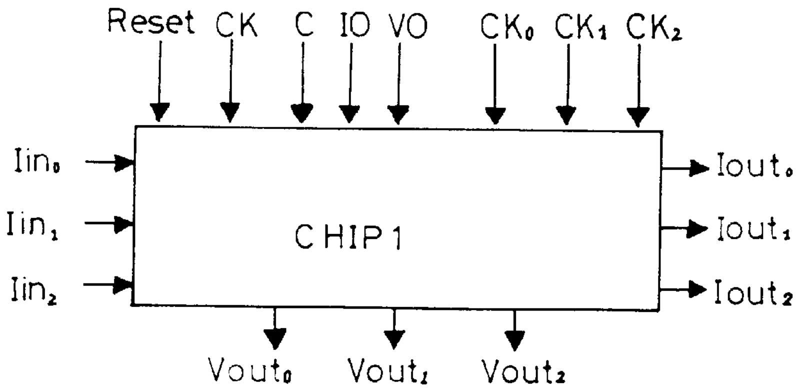
FIG. 2 shows the pin configuration of the current sorter for operating in a single mode.
Figure 3:
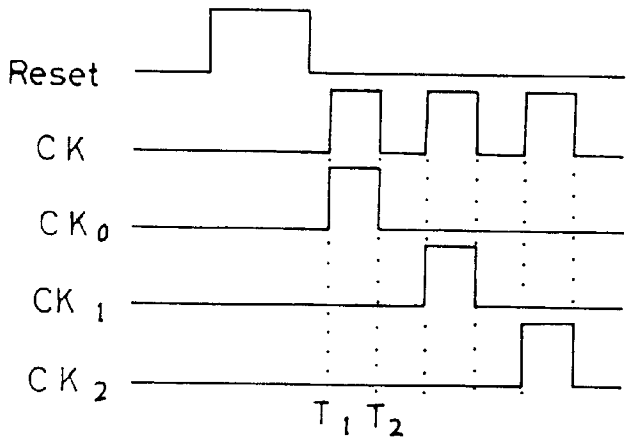
FIG. 3 is a timing diagram for the current sorter operating in the single mode.

Taking N=3 and M=2 for example, FIG. 2 and FIG. 3 show the pin configuration and timing diagrams for a chip in the single mode. To operate in the single mode, the control terminal C is set to high, the IO and VO terminals are floating, and the gates and drains of $M_{28}$ and $M_{31}$ are short-connected respectively. The operation of sorting is started by first asserting a high voltage level of reset signal which results in the $Vout_i$ ($0 \leqq i \leqq 2$) being low voltage levels and $CT_i$($0 \leqq i \leqq 2$) being high voltage levels whereby $I_i$ ($0 \leqq i \leqq 2$)=$Iin_i$ ($0 \leqq i \leqq 2$) in the input circuit unit 10. In addition, the VSout of the WTA circuit unit 20 is sampled by the feedback control and voltage output circuit unit 30 due to the high voltage level of the CT. Assuming $Iin_0$=max ($Iin_0$, $Iin_1$, $Iin_2$), the maximum current $I_{wout}$=$Iin_0$=max ($Iin_0$, $Iin_1$, $Iin_2$) is obtained from the WTA circuit unit 20. Meanwhile, $VSout_0$ is high and $VSout_1$ and $VSout_2$ are low. At the instance of T1, clock signals CK and $CK_0$ become high. In the output circuit unit 40, the high $CK_0$ drives the switch transistor $M_{23}$ on and the maximum current $I_{wout}$ is mirror-mapped to the drain of $M_{35}$ to generate $Iout_0$, that is, $Iout_0$=$I_{wout}$=$Iin_0$. In the feedback control and voltage output unit 30, the high $VSout_0$ causes $Vout_0$ to be high while $Vout_1$ and $Vout_2$ remain low due to the low voltage levels of $VSout_1$ and $VSout_2$. At the instance of T2, clock signals CK and $CK_0$ become low. In the output circuit unit 40, the switch transistor $M_{23}$ is off and $Iout_0$ is still the maximum current $Iin_0$ due to the sampling/holding effect of the switch current mirror. In the feedback control and voltage output unit 30, the low CK causes $Vout_0$ and $CT_0$ to be low while $Vout_1$ and $Vout_2$ remain low and $CT_1$ and $CT_2$ remain high. Thus, a high voltage pulse is generated on the $Vout_0$ terminal. On the other hand, the low $CT_0$ isolates a portion of the feedback control and voltage output unit 30, which is corresponding to $Iin_0$, from unit 2 whereby $Vout_0$ and $CT_0$ always remain low until the next reset signal is inserted. In the input circuit unit 10, the low $CT_0$ makes $M_{13}$ off resulting in $I_0$ being zero, whereby $I_0$ will not influence the sequential operations. Similarly, the second maximum current is determined by the process described above and held on $Iout_1$ terminal. A high voltage pulse is also generated on the corresponding Vout terminal. In this manner, all of the input currents to-be-sorted are presented on $Iout_i$ ($0 \leqq i \leqq 2$) in an order of magnitude under the control of the clock signals. Meanwhile, high voltage pulses are sequentially generated on the corresponding Vout terminals for determining the input terminals with respect to the sorted currents.

Figure 4:
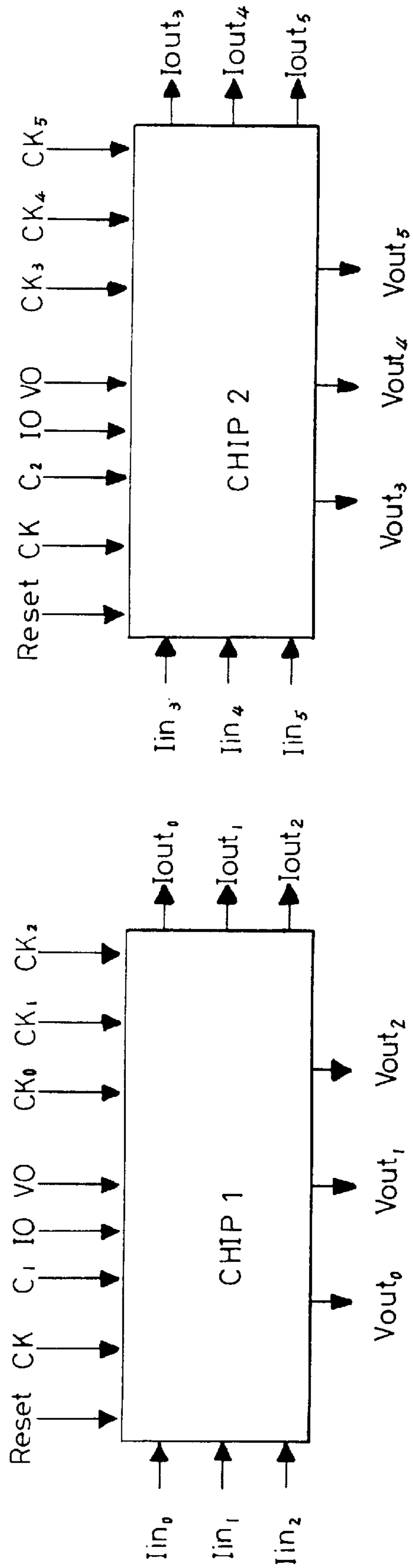
FIG. 4 shows the pin configuration of the current sorter for operating in an expanded mode.
Figure 5:
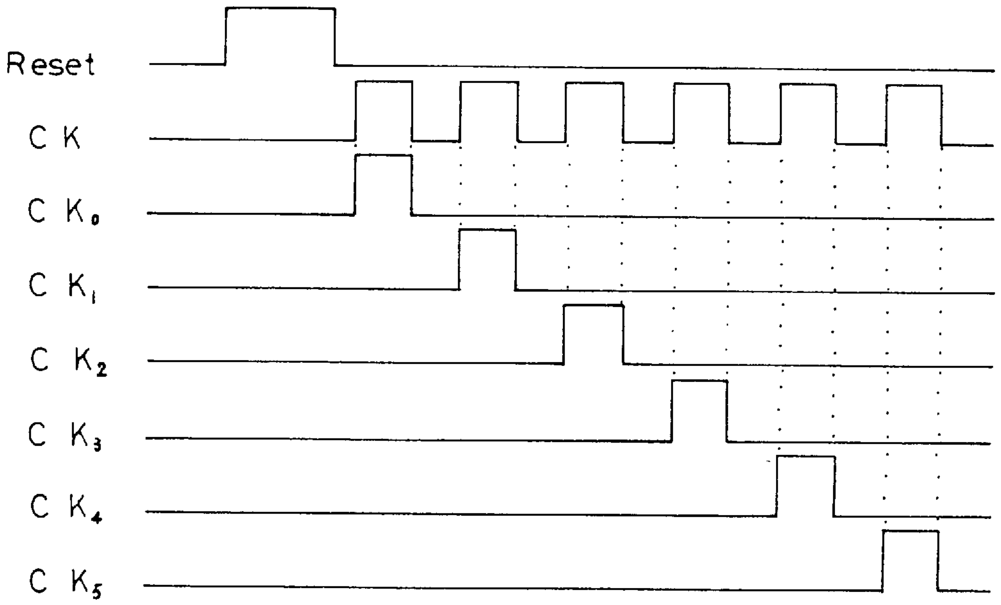
FIG. 5 is a timing diagram for the current sorter operating in the expanded mode.

In the expanded mode, it is able to sort M×N currents by expanding M chips, each having N current inputs. In this mode, the reset terminals, the CK terminals, the VO terminals and the IO terminals of the M chips are connected together respectively. Meanwhile, one of the control terminal C is set to high and the others are set to low. For convenience, taking N=3 and M=2 for example, FIG. 4 and FIG. 5 give the pin configuration and timing diagrams respectively. Assuming that $C_1$ is set to high and $C_2$ is set to low, referring to FIG. 1 again, the gate voltage of the NMOS transistor $M_{28}$ in chip 2 is low and the gate voltage of the PMOS transistor $M_{31}$ is high; that is, the $M_{28}$ and $M_{31}$ do not have any effect on sorting operations. Thus, the $M_{28}$ and $M_{31}$ in chip 1 are shared by two chips. Obviously, the two chips, each having three inputs, have been merged to one chip having six current inputs. The operation of this sixinput chip is similar to that of the three-input chip as described above; that is, all of the input currents to-be-sorted are presented on $Iout_i$ ($0 \leqq i \leqq 5$) in an order of magnitude under the control of the clock signals and high pulses are sequential generated on the corresponding Vout terminals.

Figure 6:
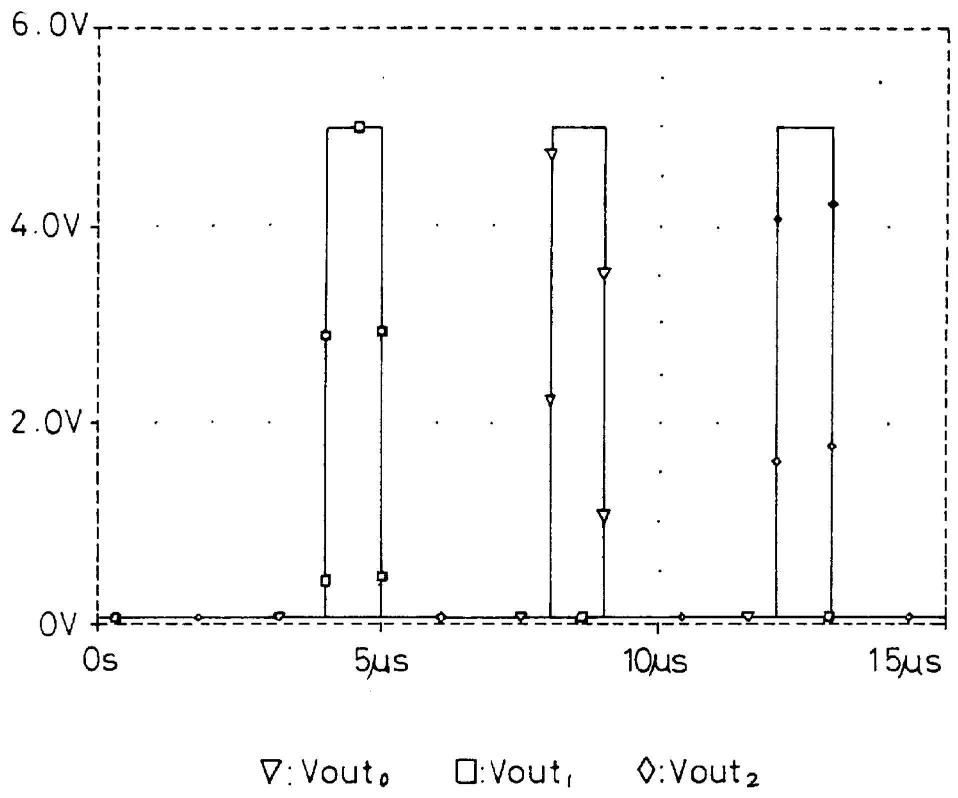
FIG. 6 illustrates a simulation result of the pulse shape of Vout of the first case in Table 1 which gives PSPICE simulation results for three cases in the single mode.
Figure 7:
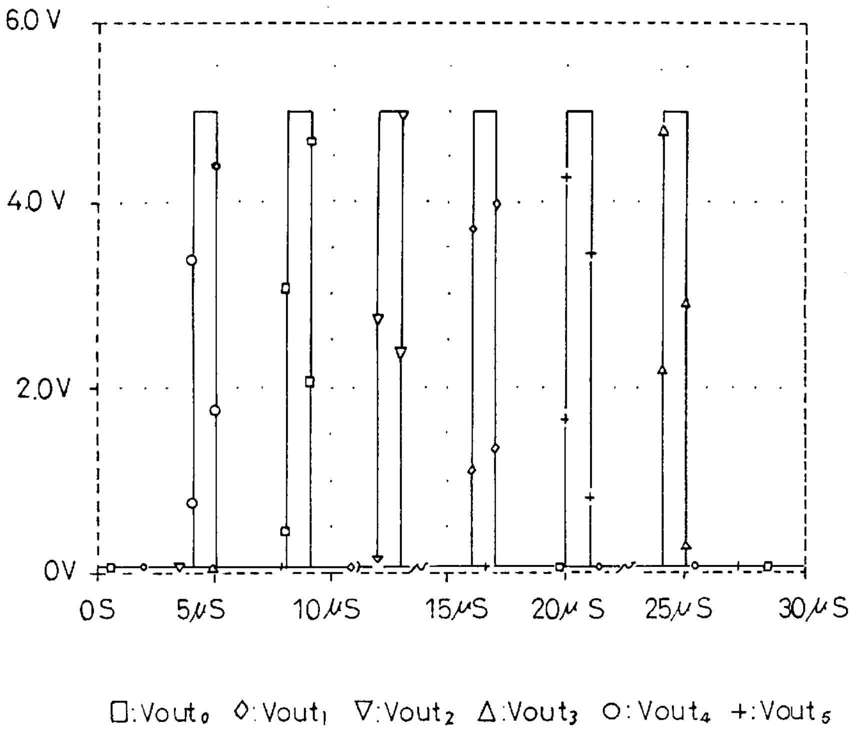
FIG. 7 illustrates a simulation result of the pulse shape of Vout of the first case in Table 2 which gives PSPICE simulation results for three cases in the expanded mode.

It is appreciated that, no matter whether in the single mode or in the expanded mode, the sorting time is linear relative to the number of input currents N; that is, the time complexity of sorting is O(N). In terms of the circuit structure, due to its simple structure, the chip area is linear relative to the number of input currents; that is, the area complexity is also O(N). Moreover, the sorter is ideally suited for various applications. Because the current outputs lout and voltages Vout are generated individually, it is possible to select the desired pins as required. The manner for outputting current can be controlled by adjusting the clock $CK_i$ in the output circuit unit 40. For example, when only $CK_0$ is asserted, the sorter is simplified to be a circuit for finding the maximum current, and when only $CK_2$ is asserted, it is simplified to be a circuit for finding the minimum current PSPICE simulations are made to the current sorter for several typical cases as shown in FIG.6 and FIG. 7. In the single mode, a simulation is made by taking M=1 and N=3 for example. For a first case, $Iin_i$ (i=0,1,2) are 135 $\mu$A, 140 $\mu$A and 130 $\mu$A respectively. For a second case, $Iin_i$ (i=0,1,2) are 90 $\mu$A, 95 $\mu$A and 100 $\mu$A respectively. For a third case, $Iin_i$ (i=0, 1,2) are 50 $\mu$A, 40 $\mu$A and 45 $\mu$A respectively. Referring to FIG. 6, a simulation output waveform of $Vout_i$ (i=0,1,2) is given for the first case. Table 1 gives the output values of $Iout_i$ (i=0,1,2) for the three cases and the maximum errors $\epsilon_{max}$ between the input currents and the corresponding output currents. In the expanded mode, a simulation is made by taking M=2 and N=3 for example. For a first case, $Iin_i$ (i=0,1,2,3,4,5) are 135 μA, 125 μA ,130 μA, 115 μA, 140 μA and 120 μA respectively. For a second case, $Iin_i$ (i=0,1,2,3,4,5) are 85 μA, 100 μA, 90 μA, 80 μA ,75 μA and 95 μA respectively. For a third case, $Iin_i$ (i=0,1,2,3,4,5) are 45 μA, 25 μA, 40 μA, 35 μA, 30 μA and 50 μA respectively. Referring to FIG. 7, a simulation output waveform of $Vout_i$ (i=0,1,2,4,5) is given for the first case. Table 2 gives the output values of $Iout_i$ (i=0,1,2,3,4,5) for the three cases and the maximum errors $\epsilon_{max}$ between the input currents and the corresponding output currents. According to the PSPICE simulation results, it is known that the offset between an input current and its corresponding output current is small. The maximum offset is smaller than 5 μA and thus the current sorter in accordance with the present invention has an advantage in providing high distinguishing capability.

Although the present invention has been explained in relation to its preferred embodiment, it is to be understood that many other possible modifications and variations can be made without departing from the spirit and scope of the invention as hereinafter claimed.

What is claimed is:

1. A current sorter comprising:

an input circuit unit having a plurality of inputs and a plurality of outputs, said plurality of inputs being adapted for receiving a plurality of input currents and said plurality of outputs being provided for outputting the received input currents;

a winner-take-all (WTA) circuit unit receiving said plurality of input currents from said input circuit, for determining a maximum current among the received plurality of input currents, and generating a plurality of first voltage output signals respectively corresponding to the received plurality of input currents for indicating said maximum current;

a feedback control and voltage output unit receiving a first clock signal and said plurality of first voltage output signals from said winner-take-all circuit unit, generating a plurality of feedback control signals according to said plurality of first voltage output signals in one operation cycle controlled by said first clock signal to control the outputs of said input circuit unit wherein a feedback control signal corresponding to the first voltage output signal indicating said maximum current is set inactive for guiding said input circuit unit to clear a corresponding input current, and converting said plurality of first voltage output signals to a plurality of second voltage output signals in said operation cycle wherein said first voltage output signals are voltage level signals and said second voltage output signals are voltage pulse signals; and an output circuit unit sequentially receiving said determined maximum current from said winner-take-all circuit unit under the control of a plurality of non-overlapped second clock signals whereby said plurality of input currents are present in order on a plurality of output terminals of said output circuit unit.

2. The current sorter as claimed in claim 1, wherein said input circuit unit comprises a plurality of input units each including two current mirrors and a switch transistor.

3. The current sorter as claimed in claim 2, wherein said winner-take-all circuit comprises a plurality of sections, the number of said sections being the same as that of said input units, each of said sections being connected to one of said input units; said plurality of sections constitute a differential circuit and each section includes a Willson current mirror.

4. The current sorter as claimed in claim 3, wherein said feedback control and voltage output circuit unit comprises a plurality of identical transfer units, the number of said transfer units being the same as that of said input units, each of said transfer units including a plurality of CMOS switches, and being connected to one of said sections of said winner-take-all circuit unit.

5. The current sorter as claimed in claim 4, wherein said output circuit unit includes a plurality of switch transistors and mirror transistors.

6. A current sorter comprising:

an input circuit unit having a plurality of inputs and a plurality of outputs, said plurality of inputs being adapted for receiving a plurality of input currents and said plurality of outputs being provided for outputting the received input currents;

a winner-take-all (WTA) circuit unit receiving said plurality of input currents from said input circuit for establishing a plurality of representing voltages corresponding thereto wherein the maximum one among said plurality of representing voltages generates a representing current and a winner current equal to the maximum current among said received plurality of input currents on an IO terminal, said representing current being controlled by a control terminal to be output on a VO terminal, and generating a plurality of first voltage output signals respectively corresponding to the received plurality of input currents for indicating said maximum current;

a feedback control and voltage output unit receiving a first clock signal, via a first clock terminal, and said plurality of first voltage output signals from said winner-take-all circuit unit, generating a plurality of feedback control signals according to said plurality of first voltage output signals in one operation cycle controlled by said first clock signal to control the outputs of said input circuit unit wherein a feedback control signal corresponding to the first voltage output signal indicative said maximum input current is set inactive for guiding said input circuit unit to clear a corresponding input current, and converting said plurality of first voltage output signal to a plurality of second voltage output signals in said operation cycle wherein said first voltage output signals are voltage level signals and said second voltage output signals are voltage pulse signals; a reset terminal being provided for receiving reset signals to reset said feedback control and voltage output unit; and an output circuit unit sequentially receiving said determined maximum current from said IO terminal of said winner-take-all circuit unit under the control of a plurality of non-overlapped second clock signals wherein said output circuit unit is controlled by said control terminal to receive said winner current, whereby said plurality of input currents are orderly present on a plurality of output terminals of said output circuit unit.

7. The current sorter as claimed in claim 6, wherein said input circuit unit comprises a plurality of input units each including two current mirrors and a switch transistor.

8. The current sorter as claimed in claim 7, wherein said winner-take-all circuit comprises a plurality of sections, the number of said sections being the same as that of said input units, each of said sections being connected to one of said input units; said plurality of sections constitute a differential circuit and each section includes a Willson current mirror.

9. The current sorter as claimed in claim 8, wherein said feedback control and voltage output circuit unit comprises a plurality of identical transfer units, the number of said transfer units being the same as that of said input units, each of said transfer units including a plurality of CMOS switches, and being connected to one of said sections of said winner-take-all circuit unit.

10. The current sorter as claimed in claim 9, wherein said output circuit unit includes a plurality of switch transistors and mirror transistors.

11. A current sorting circuit comprising a plurality of current sorters as claimed in claim 6 wherein said reset terminals, said first clock terminals, said VO terminals, and said IO terminals of said plurality of current sorters are connected together respectively and wherein one of said control terminal is set to be high and the others are set to be low.

* * * * *